United States Patent
Zinman et al.

(10) Patent No.: US 6,177,356 B1
(45) Date of Patent: Jan. 23, 2001

(54) SEMICONDUCTOR CLEANING APPARATUS

(75) Inventors: Yosef Zinman, Tel Aviv; Alex Sergienko, Karmiel; Igor Rapoport; Yosef Raskin, both of Kiriat Bialik; Solomon Zaidman, Magiot, all of (IL)

(73) Assignee: Sizary Ltd., Migdal Tefen (IL)

( * ) Notice: Under 35 U.S.C. 154(b), the term of this patent shall be extended for 0 days.

(21) Appl. No.: 09/090,742

(22) Filed: Jun. 4, 1998

(30) Foreign Application Priority Data

Jun. 5, 1997 (IL) .......................................... 121010
Nov. 13, 1997 (IL) .......................................... 122193

(51) Int. Cl.$^7$ ................................................. H01L 21/3065
(52) U.S. Cl. ......................... 438/729; 438/906; 134/1.2; 156/345
(58) Field of Search .......................... 156/345; 438/905, 438/906, 729; 134/1.1, 1.2, 1.3

(56) References Cited

U.S. PATENT DOCUMENTS

| | | | |
|---|---|---|---|
| 4,201,579 | * 5/1980 | Robinson et al. | ............... 156/345 X |
| 4,534,921 | 8/1985 | Fierkens et al. . | |
| 4,870,245 | 9/1989 | Price et al. . | |
| 4,919,769 | 4/1990 | Lin . | |
| 4,983,255 | 1/1991 | Gruenwald et al. . | |
| 5,084,125 | 1/1992 | Aoi . | |
| 5,410,122 | 4/1995 | Su et al. . | |
| 5,484,483 | 1/1996 | Kyogoku . | |
| 5,484,484 | 1/1996 | Yamaga et al. . | |
| 5,514,246 | * 5/1996 | Blalock | ............... 134/1.1 X |
| 5,868,848 | * 2/1999 | Tsukamoto | ............... 118/723 E |
| 5,926,743 | * 7/1999 | Xi et al. | ............... 134/1.1 X |
| 5,945,354 | * 8/1999 | Mautz | ............... 134/1.2 X |

FOREIGN PATENT DOCUMENTS

| | | |
|---|---|---|
| 39 04969 A1 | 9/1989 | (DE) . |
| 0 414 038 A2 | 2/1991 | (EP) . |
| 07 022 400 | 1/1995 | (JP) . |

* cited by examiner

*Primary Examiner*—Thi Dang
(74) *Attorney, Agent, or Firm*—Darby & Darby (57) ABSTRACT

A wafer transfer device or boat and semiconductor cleaning apparatus including a wafer transfer device and a heatable reaction core is provided. The wafer transfer device has a first unit with a plurality of first slots for receiving a first group of semiconductor wafers and a second unit with a plurality of slots for receiving a second group of semiconductor wafers. The first slots alternate with the second slots. The first unit is connectable to a first voltage source and the second unit is connectable to a second voltage source. The second voltage source is more electronegative than the first one. Typically, the first group of semiconductor wafers have impurities therein which are to be removed and the second group of semiconductor wafers are to receive the impurities. A method for protecting a plurality of semiconductor wafers includes the steps of placing the plurality of semiconductor wafers within a heatable reactor core, having a core collector electrode mounted on the outside of the heatable reactor core and having a conductive element located within the reactor core. The core collector element receives a first voltage level, and the conductive element receives a second voltage level greater than the first voltage level. A multiplicity of ions from within the reactor core are attracted to the outside of the reactor core, thereby protecting the plurality of silicon wafers from possible contamination originating from the multiplicity of ions.

4 Claims, 9 Drawing Sheets

SEMICONDUCTOR CLEANING APPARATUS

FIELD OF THE INVENTION

The present invention relates to methods and apparatus for cleaning semiconductor wafers generally and to such methods and apparatus utilizing thermoemission in particular.

BACKGROUND OF THE INVENTION

The steps of the production of semiconductor silicon integrated circuits must be very clean, because even small amounts of undesirable contaminating impurities can cause complete degradation or malfunction of integrated circuits. Thus, semiconductor silicon wafers must be cleaned between processing steps.

There exist many cleaning processes used in silicon semiconductor production. Wet cleaning processes usually remove contaminants from the silicon wafer surface with special chemical solutions as part of a separate production step. Dry cleaning processes usually remove contaminants by etching the contaminants from the wafer surface within some gas or gas mixture or within a plasma environment. Gettering processes utilize the tendency for contaminants to move towards special traps inside the silicon wafer (areas with a high density of such traps are called "getters") and to stay stable within the traps.

However, wet and dry cleaning processes can only remove contaminants from the silicon wafer surface. Gettering processes can be used only for some types of contaminants (such as iron, copper, nickel etc.).

European Patent Publication EP-A-0749153, assigned to the common owners of the present application, describes a cleaning method which utilizes an electric field in the presence of heat to move positively charged impurity ions from the semiconductor wafer surface and above it towards a negatively charged electrode (called the "collector").

Figure 1:
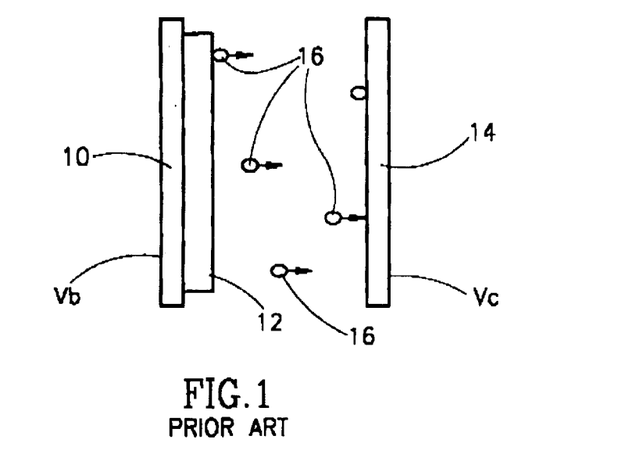
FIG. 1 is a schematic illustration of a prior art thermoemission system.

The apparatus of European Patent Publication EP-A-0749153 is schematically illustrated in FIG. 1 to which reference is now briefly made. The electric field is created between the electrodes, one of which, labeled 10, is attached to the wafer 12 to be cleaned. The other electrode (the "collector"), labeled 14, is placed at a distance therefrom. Wafer electrode 10 is connected to a voltage source output Vb and the electrode 14 is connected to another source output Vc, where the potential Vc is more electronegative than the potential Vb. Thus, an electric field is created to move positive ions, labeled 16, from the wafer area toward the collector electrode 14, where positive ions will be absorbed (captured). Typically, the apparatus is placed in a vacuum or in presence of a gas mixture and heated to initiate ion emission from the wafer surface. EP Publication EP-A-0749153, also describes utilizing a plasma between the two electrodes 10 and 14 to strengthen the electric field over the wafer surface.

SUMMARY OF THE PRESENT INVENTION

It is an object of the present invention to provide methods and apparatus for batch cleaning of semiconductor wafers using thermoemission. These methods and apparatus can be utilized, in particular, within high temperature ovens, reactors or rapid thermal tools such as are common in the semiconductor manufacturing process.

There is therefore provided, in accordance with a preferred embodiment of the present invention, a collector electrode formed of semiconductor wafer. The semiconductor wafer can have an unpolished surface, a rough surface or an oxidized surface.

There is also provided, in accordance with a preferred embodiment of the present invention, a wafer transfer device or boat having a first unit with a plurality of first slots for receiving a first group of semiconductor wafers and a second unit with a plurality of slots for receiving a second group of semiconductor wafers. The first slots alternate with the second slots. The first unit is connectable to a first voltage source and the second unit is connectable to a second voltage source. The second voltage source is more electronegative than the first one. Typically, the first group of semiconductor wafers have impurities therein which are to be removed and the second group of semiconductor wafers are to receive the impurities.

Additionally, in accordance with a preferred embodiment of the present invention, the first unit is a lower layer of conductive material and the second unit is an upper layer of conductive material. The second unit has a plurality of third slots, aligned with the first slots and the third slots are wider and longer than the first slots.

Moreover, in accordance with a second preferred embodiment of the present invention, the first unit is a first support wall formed of alternating conductive and isolating supports and the second unit is a second support wall formed of alternating isolating and conductive supports. Each semiconductor wafer is supported horizontally by one conductive and one isolating support.

Further, in accordance with a third preferred embodiment of the present invention, the wafer transfer device additionally includes two support rods of isolating material. The first unit is a first rod of conductive material and the second unit is a second rod of conductive material. The first rod has alternating small and large slots and the second unit has alternating large and small slots such that each semiconductor is held by one small slot and floats in one large slot.

Additionally, in accordance with a preferred embodiment of the present invention, the first semiconductor wafers are to be cleaned and the second semiconductor wafers are collector electrodes.

There is further provided, in accordance with a preferred embodiment of the present invention, a semiconductor cleaning unit including a heatable reaction core, a core collector electrode and a wafer transfer device. The core collector electrode is mounted to the reaction core and is connectable to a first, core voltage source Va. The wafer transfer device transfers at least one semiconductor wafer to be cleaned to within the reaction core. The wafer transfer device is connectable to at least a second, wafer voltage source Vb. Va is more electronegative than Vb.

Moreover, in accordance with a preferred embodiment of the present invention, the core collector electrode is mounted to the outside of the reaction core.

Further, in accordance with a preferred embodiment of the present invention, the wafer transfer device has a first unit receives a first group of semiconductor wafers and a second unit which receives a second group of semiconductor wafers. The first unit has slots which alternate with slots of the second unit. The first unit connectable to the wafer voltage source Vb and the second unit connectable to a third, collector voltage source Vc. The collector voltage source Vc is more electronegative than Vb.

Still further, in accordance with a preferred embodiment of the present invention, the first semiconductor wafers are to be cleaned and the second semiconductor wafers are collector electrodes.

There is alternatively provided, in accordance with a preferred embodiment of the present invention, a semiconductor cleaning unit which includes a heatable reaction core and a wafer transfer device. The latter transfers a plurality of semiconductor wafers to within the reaction core and has a first slotted unit for receiving a first group of semiconductor wafers to be cleaned and a second slotted unit for receiving a second group of semiconductor wafers forming collector electrodes. The slots of the first unit alternate with the slots of the second unit. The first unit is connectable to a first voltage source Vb and the second unit is connectable to a second voltage source Vc.

Finally, there is provided, in accordance with a preferred embodiment of the present invention, a reaction core cleaning unit including a heatable reaction core, a core collector electrode and a conductive element. The core collector electrode is mounted to the reaction core and is connectable to a first, core voltage source Va. The conductive element is locatable within the reaction core and is connectable to at least a second voltage source having a voltage level greater than the voltage level of the core voltage source. The core collector electrode can be mounted to the inside or outside of the reaction core.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

Figure 2:
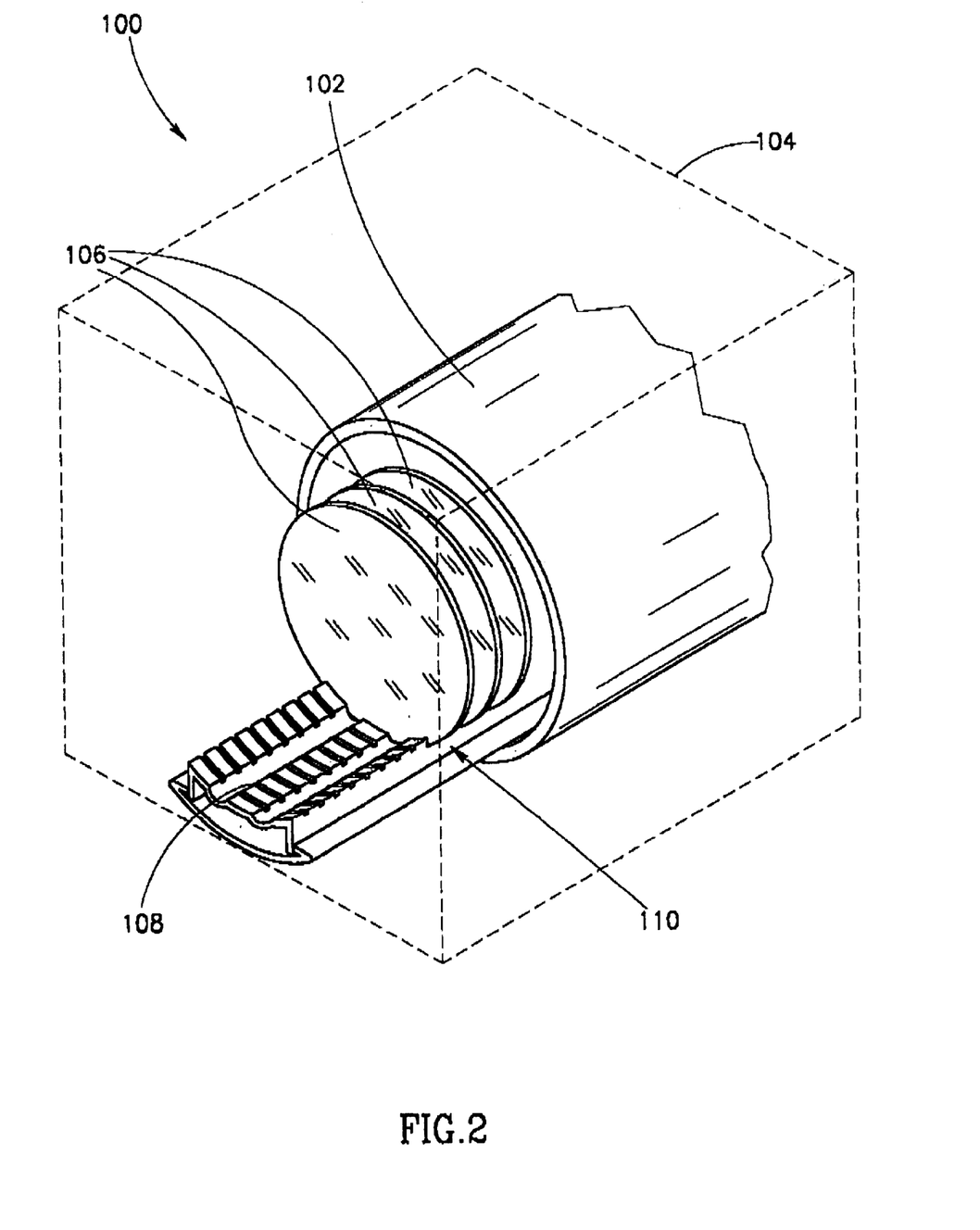
FIG. 2 is an exemplary prior art semiconductor processing machine.

Reference is now made to FIG. 2 which illustrates an exemplary prior art semiconductor processing machine 100. The machine has a reaction core 102 housed within a housing 104. The desired process, annealing, oxidation, epitaxial growth, LPCVD, etc., occurs within the reaction core 102 to a batch of semiconductor wafers 106. Typically, the wafers 106 are mounted on a transfer device 108 of some kind, such as a boat, paddle, carrier, etc., with which the batch of wafers 106 are transferred. As shown in FIG. 2, the processing machine includes a conveying unit 110 which carries the transfer device 108 from the outside to the inside of the processing machine.

In accordance with a preferred embodiment of the present invention, the electric field cleaning of EP Publication EP-A-0749153 is performed within the reaction core 102 of a prior art oven or rapid thermal tool to one or more wafers 106. In each of the embodiments described hereinbelow, a single wafer 106 or a batch of contaminated wafers 106 are placed within the transfer device 108 after which the transfer device 108 is placed within the reaction core 102. Within transfer device 108 is formed a first electrode to which all of the wafers 106 are connected. The location of the collector electrode varies with the different embodiments. In some embodiments, a vacuum is created within the reaction core 102 into which an inert gas or gas mixture is pumped. In other embodiments, a vacuum is not created. The reaction core is then heated to a temperature between 300 and 1300° C. and an electric field is formed between the two electrodes. Alternatively, there can be many electrodes among which the electric field is formed.

If desired, a plasma can be introduced into the reaction core 102 to strengthen the electric field, as described in EP Publication EP-A-0749153. Also, if desired, oxygen gas can be introduced into the reaction core 102 thereby to cause oxidation to occur during the cleaning process.

The various embodiments of the present invention provide in-situ cleaning for most semiconductor processing machines, such as those providing high temperature annealing, high temperature oxidation, photoresist removal, plasma processing, chemical vapor deposition (CVD), silicon epitaxial growth, rapid thermal processing, etc. For each of these machines, the cleaning operation can occur before, during or after the manufacturing process.

Figure 3:
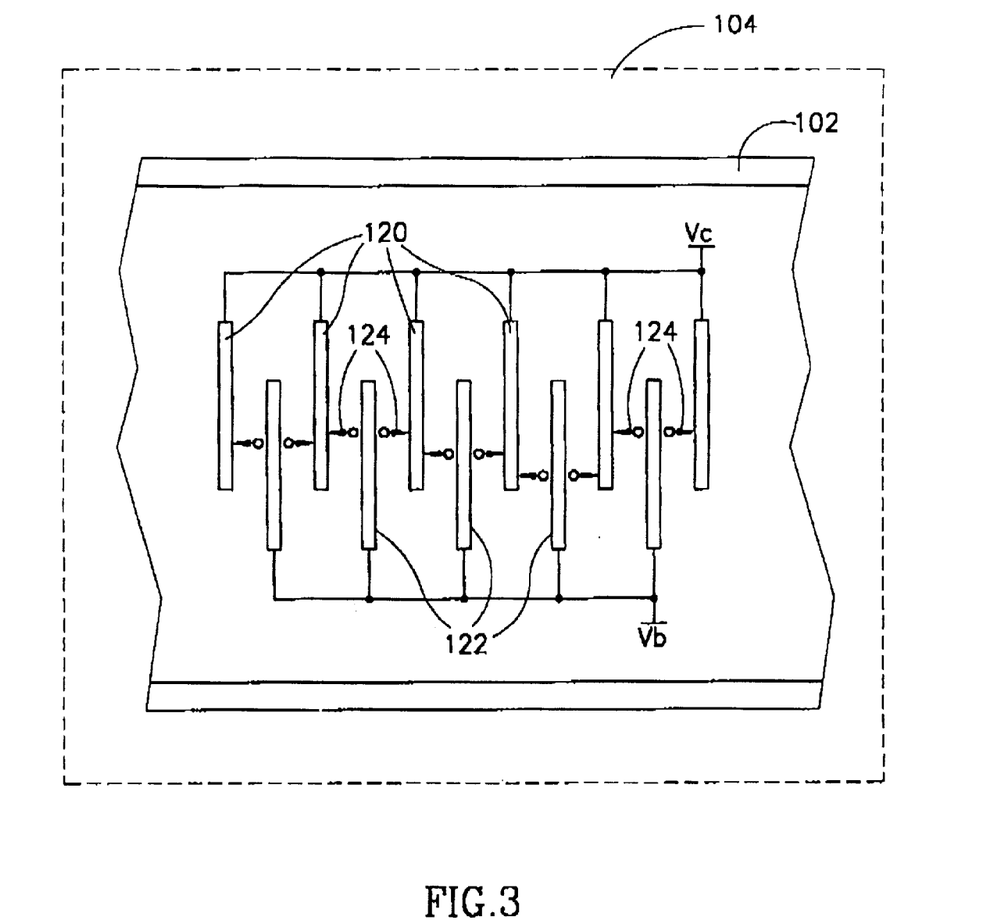
FIG. 3 is a schematic illustration of a thermoemission system for batch processing, constructed and operative in accordance with a preferred embodiment of the present invention.

Reference is now made to FIG. 3 which illustrates a first apparatus for batch processing. In this embodiment, the collector electrodes are not metal sheets as described in EP Publication EP-A-0749153. Rather, they are other semiconductor wafers, labeled 120, connected to the collector voltage source Vc. Thus, the collector wafers 120 collect the contamination impurities from the contaminated wafers, labeled 122, to be cleaned. This is particularly advantageous since semiconductor wafers easily absorb the contaminants and thus, the collector wafers 120 typically collect more contaminant than metal sheets.

Collector wafers 120 can be processed or unprocessed. It is believed that unpolished wafers are advantageous. A rough surface and one which is oxidized are also preferable, though not necessary.

In the embodiment of FIG. 3, the collector wafers 120 are placed between the contaminated wafers 122 in comb-like manner. With a collector wafer 120 on either side of a contaminated wafer 122, each side of each contaminated wafer 122 will be cleaned. This is indicated by impurity ions 124 which flow from either side of contaminated wafers 122 towards collector wafers 120.

The wafer arrangement of FIG. 3 is placed in a transfer device (not shown) in which the collector wafers 120 are connected to collector voltage source Vc and the contaminated wafers 122 are connected to the wafer voltage source Vb. Wafer voltage source Vb is more electropositive than Vc. The transfer device is conveyed to within the reaction core 102 which is then heated to a sufficient temperature, such as in the range 400–1250° C., in the environment of a vacuum, or a low pressure gas or gas mixture, or a gas or gas mixture at atmosphere pressure. This encourages the movement of positive ions.

The transfer device can be any suitable device which separately connects the contaminated wafers 122 and the collector wafers 120 to their respective power sources and which isolates the two sets of wafers from each other.

Figure 4A:
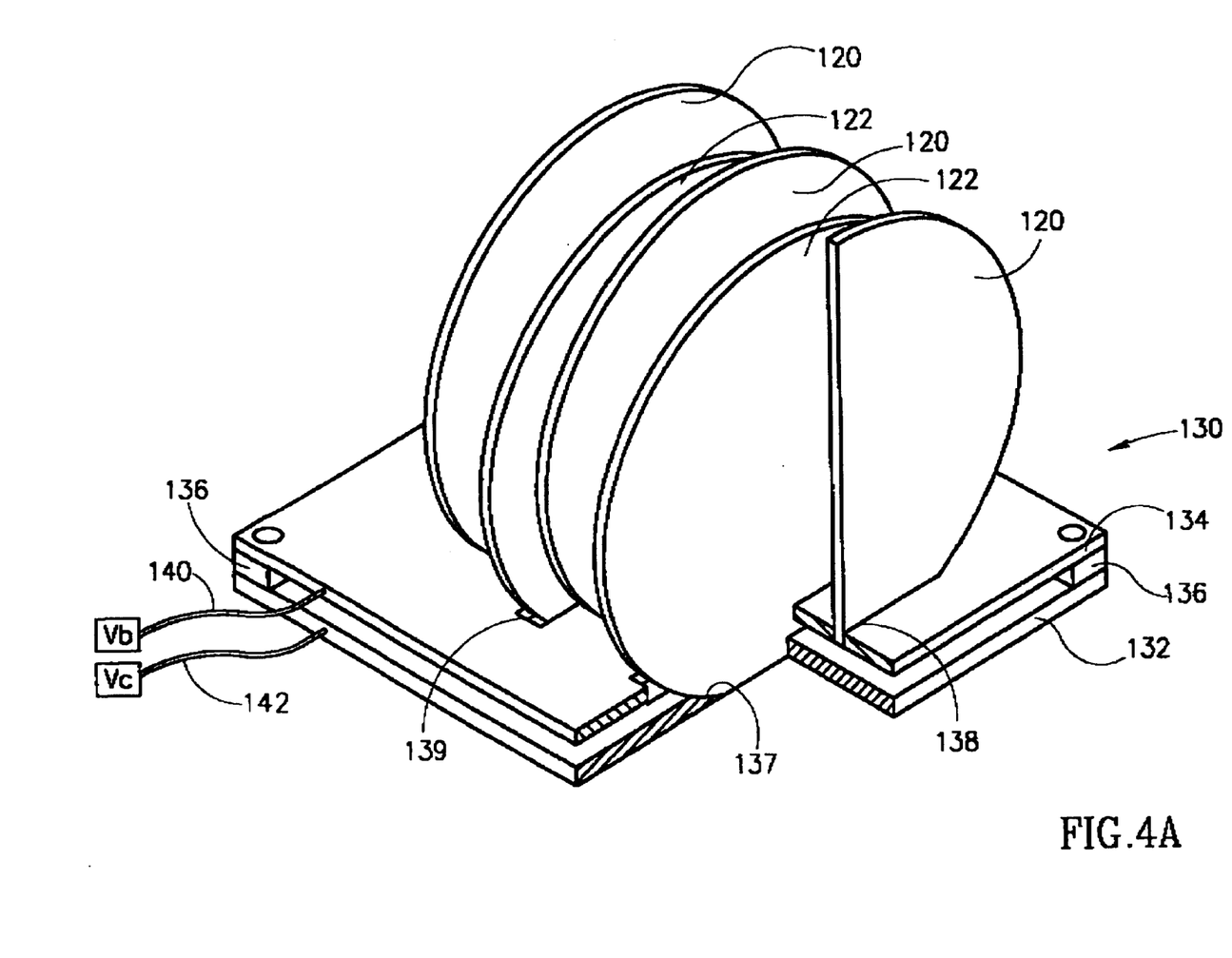
FIGS. 4A, 4B and 4C are schematic illustrations of three embodiments of a boat carrying a batch of semiconductor wafers.
Figure 4B:
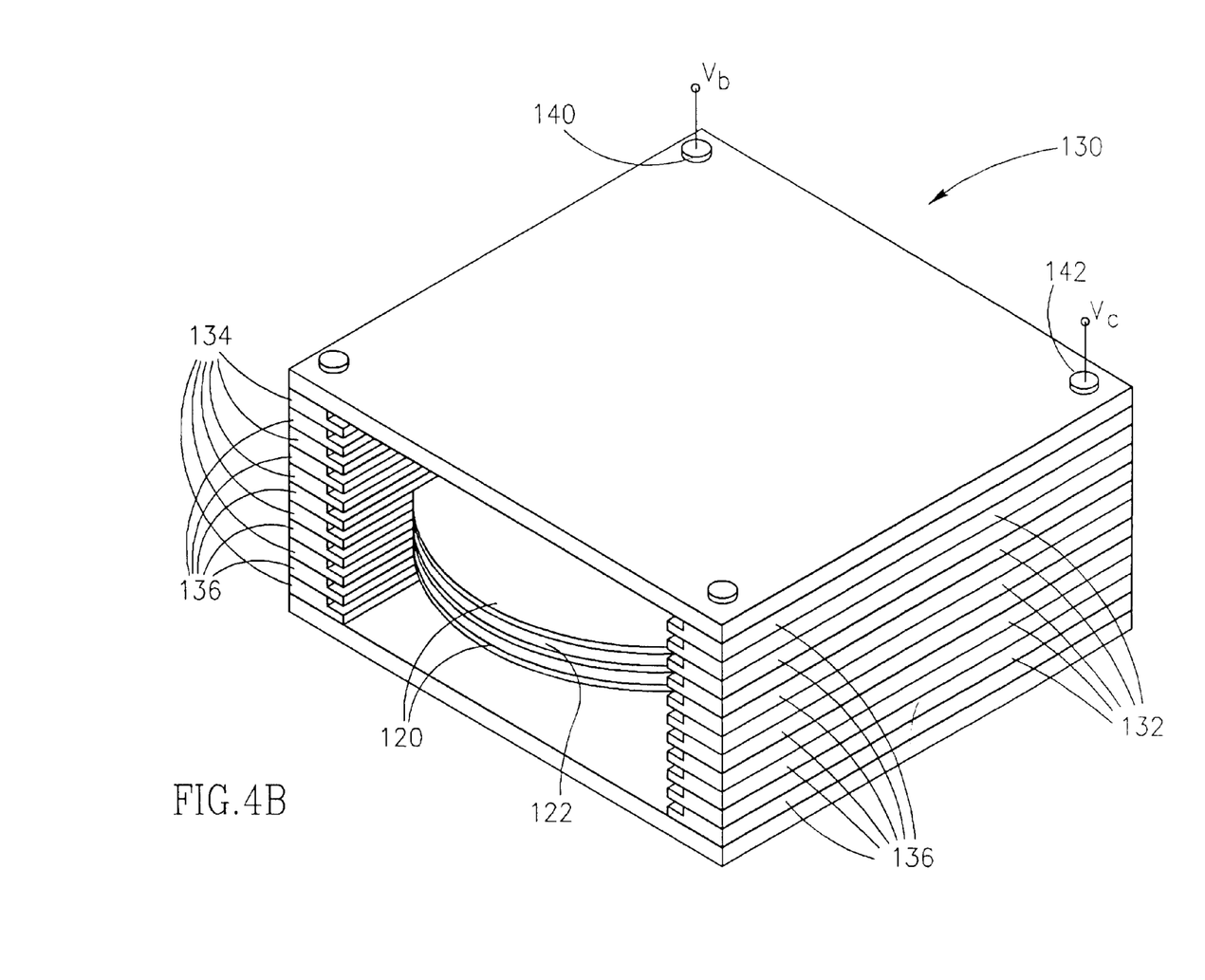
Figure 4C:
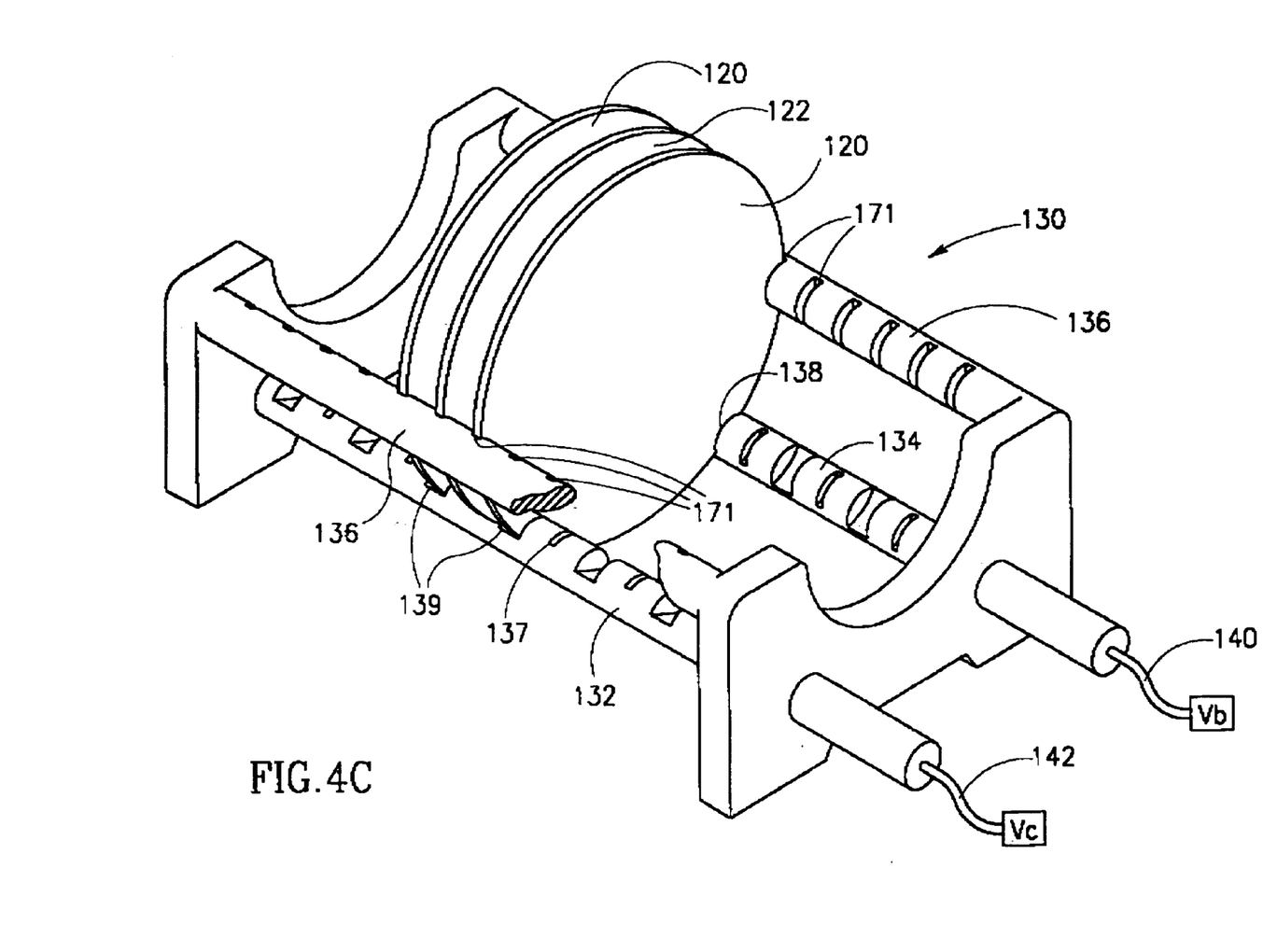

Three exemplary embodiments of a transfer device 130 are shown in FIGS. 4A, 4B and 4C to which reference is now made. FIGS. 4A and 4C show transfer devices which hold the semiconductor wafers vertically while FIG. 4B shows a transfer device which holds the semiconductor wafers horizontally.

Transfer device 130 is formed of two outer layers 132 and 134 formed of silicon or any other conductive material, such as SiC, and an inner isolating layer 136 formed of quartz or any other isolating material, such as a ceramic. Layers 132 and 134 form the connectors to the collector wafers 120 and the contaminated wafers 122, respectively. Thus, wires 140 and 142 respectively connect voltage sources Vb and Vc to layers 132 and 134.

Contaminated wafers 122 are supported by slots 137 formed in lower layer 132. Collector wafers 120 are supported by slots 138 in upper layer 134. In the boat of FIG. 4A, the contaminated wafers 122 would provide a short circuit between the two layers 132 and 134 if they touched upper layer 134. Accordingly, in the boat of FIG. 4A, upper layer 134 has large openings 139 over the locations of slots 137.

However, in the boat of FIG. 4B, this is not a problem. Instead, there are two walls of support material. One wall (the left one in FIG. 4B) has alternating sections of first conductive layer 134 and isolating layer 136. The other wall has alternating sections of isolating layer 136 and second conductive layer 132. It is noted that each semiconductor wafer sits on two sections, one which is conductive (from one wall) and one which is isolating (from the other wall).

The boat of FIG. 4C is formed of four rods, two supporting rods of isolating material 136 and two conductive rods formed of conductive layers 132 and 134. The supporting rods have slots 171 therein to hold the wafers. The conductive rods 132 and 134 have supporting slots 137 alternating with large, non-supporting slots 139. Thus, contaminated wafers 122 are held by the two supporting rods of isolating material 136, via its slots 171, and by the rod of conductive layer 132. Contaminated wafers 122 do not touch the other rod, of conductive layer 134, due to its large slots 139. Similarly, collector wafers 120 are held by the two supporting rods of isolating material 136 and by the rod of conductive layer 134, and float in the large slots 139 of the rod of conductive layer 132.

It will be appreciated that the present invention incorporates all relative locations of the supporting rods 136 and the conductive rods 137. Thus, the supporting rods 136 can be above the conductive rods 137, as shown in FIG. 4C, or the conductive rods 137 can be above the supporting rods 136 or they can be organized into any other arrangement.

Figure 5:
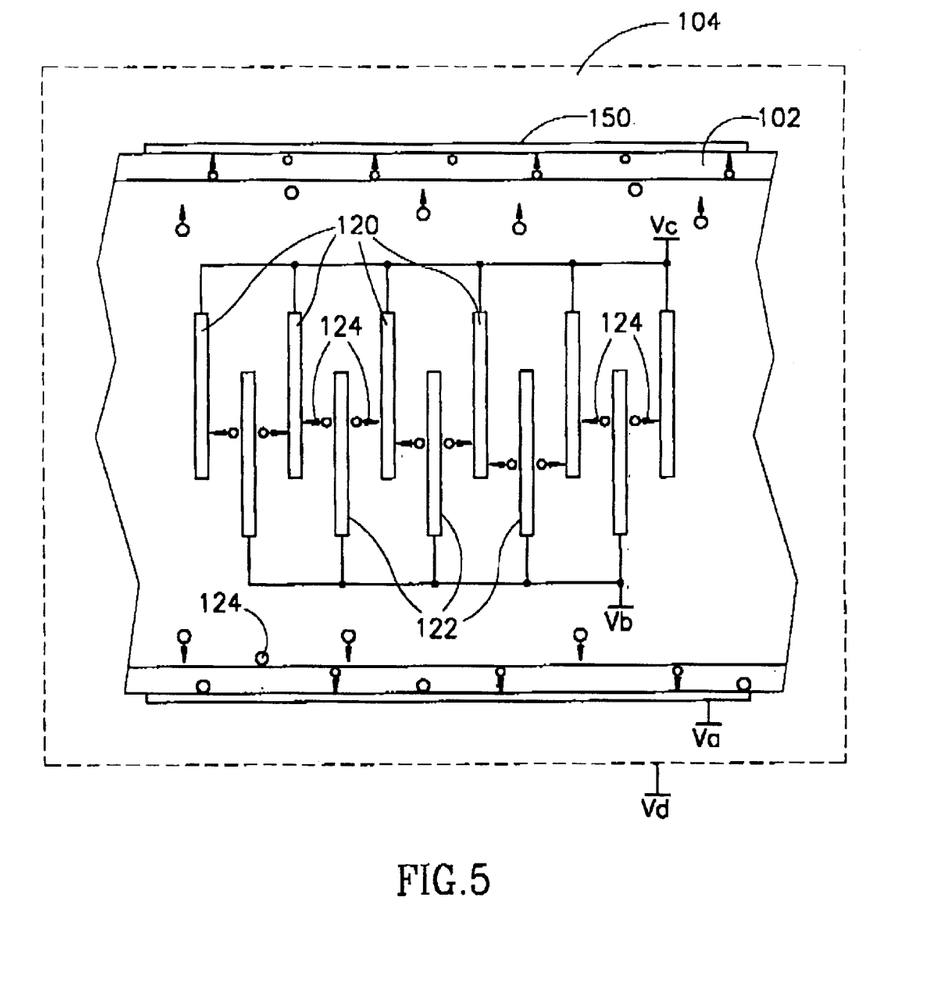
FIG. 5 is a schematic illustration of a further thermoemission system for batch processing, constructed and operative in accordance with a second preferred embodiment of the present invention.

Reference is now made to FIG. 5 which illustrates an embodiment of the present invention similar to that of FIG. 3 but in which a core collector electrode 150 is mounted to the reaction core 102. Similar elements carry similar reference numerals.

Core collector electrode 150 is typically formed of a suitably conductive and heat-resistant material, such as silicon carbide or a heat-resistant metal alloy; and is formed on the outside of reaction core 102. Core collector electrode 150 can have any suitable shape, such as a spiral, a grid, a cylinder or a thin film of metal sprayed onto the reaction core 102.

Core collector electrode 150 is connected to a core voltage source Va whose voltage level is less than or equal to wafer voltage source Vb. The housing 104 is typically maintained at a low, housing voltage Vd, such as at or close to a ground voltage level. Thus, an electric field from the contaminated wafers 122 (at voltage level Vb) to the core collector electrode 150 (at voltage level Va) is generated in addition to the electric field existing between contaminated wafers 122 and collector wafers 120.

As long as reaction core 102 is formed of a material, such as quartz, in which the mobility of ions at temperatures above 600° C. is high enough, the ions can extend through reaction core 102 and thus, as shown, core collector electrode 150 can be mounted on the outside of reaction core 102.

For the embodiment of a quartz reaction core 102, processing device 100 must heat the reaction core 102 to a temperature at or above 600° C. In the presence of the heat, ions 124 will move out of contaminated wafers 122 towards collector wafers 120, towards reaction core 102 and, through reaction core 102, towards core collector 150. If desired, a conductive medium, such as a plasma, can be generated within reaction core 102 to help the movement of the ions 124. Thus, as illustrated in FIG. 5, the combination of heat and the electric field generated between contaminated wafers 122 and core collector 150 moves ions 124 away from the cleaned contaminated wafers 122 and prevents ions 124 from flowing in the direction of the cleaned contaminated wafers 122.

It will be appreciated that when core collector 150 is mounted outside reaction core 102, the batch cleaning apparatus of FIG. 5 not only cleans contaminated wafers 122 but also helps to clean reaction core 102, since core collector 150 also attracts ions from within reaction core 102. This cleaning is not just surface cleaning, as provided for in the prior art, but cleaning form the bulk, as the ions move through reaction core 102 to its outside surface and onto core collector 150. Thus, the batch cleaning apparatus of FIG. 5, by moving the ions 124 out through to the outside surface of the reaction core 102, prevents the cleaned contaminated wafers 122 from being further contaminated by ions 124 originating from reaction core 102. For this process, the presence of the conductive medium is necessary.

Figure 6:
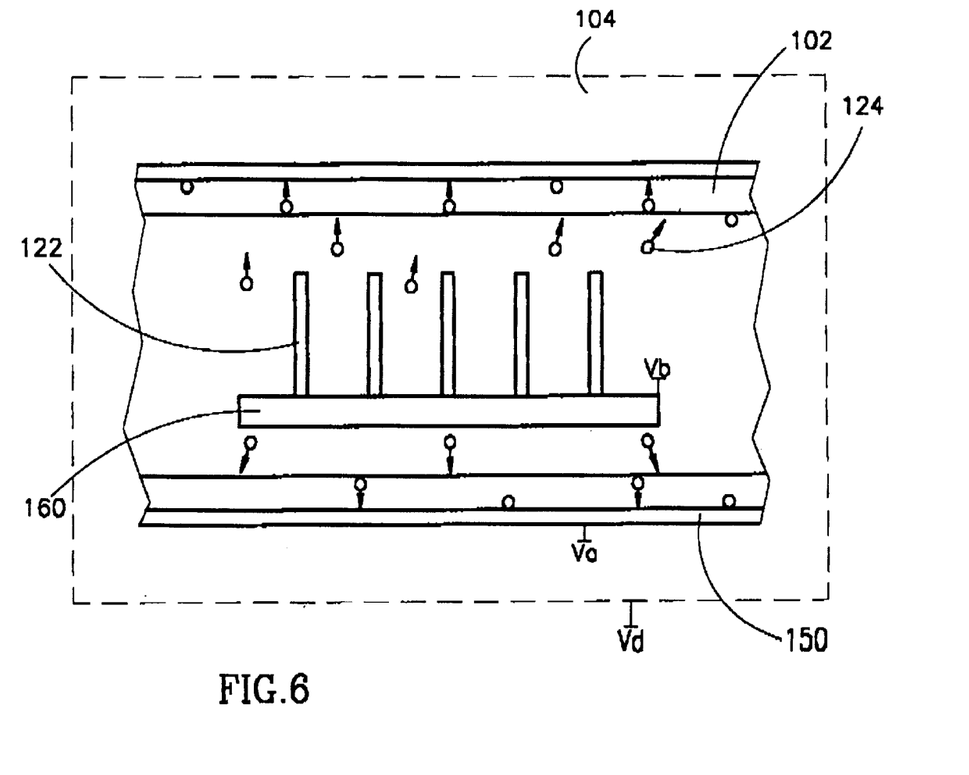
FIG. 6 is a schematic illustration of a thermoemission system for batch processing, constructed and operative in accordance with a third preferred embodiment of the present invention.

Reference is now made to FIG. 6 which illustrates an alternative embodiment of the batch apparatus of FIG. 5. In this embodiment, there are only contaminated wafers 122 attached to an at least partially conductive, transfer device 160 connected to wafer voltage source Vb. As in the embodiment of FIG. 5, core collector 150 is mounted on reaction core 102 and is connected to core voltage source Va.

In the presence of heat and the electric field generated between contaminated wafers 122 and core collector 150 (and, if desired, in the presence of a conductive medium), ions 124 move out of both sides of the contaminated wafers 122 and are collected by core collector 150. However, as illustrated in FIG. 6, ions 124 are not able to return from reaction core 102 in the direction of the cleaned contaminated wafers 122. As in the previous embodiment, this embodiment also cleans the reaction core 102, and in addition prevents the cleaned contaminated wafers 122 from being further contaminated by the heated reaction core 102, if core collector 150 is mounted on the outside of reaction core 102 and if the wafer voltage Vb is greater than the core voltage source Va and core voltage source Va is greater than housing voltage source Vd.

Figure 7:
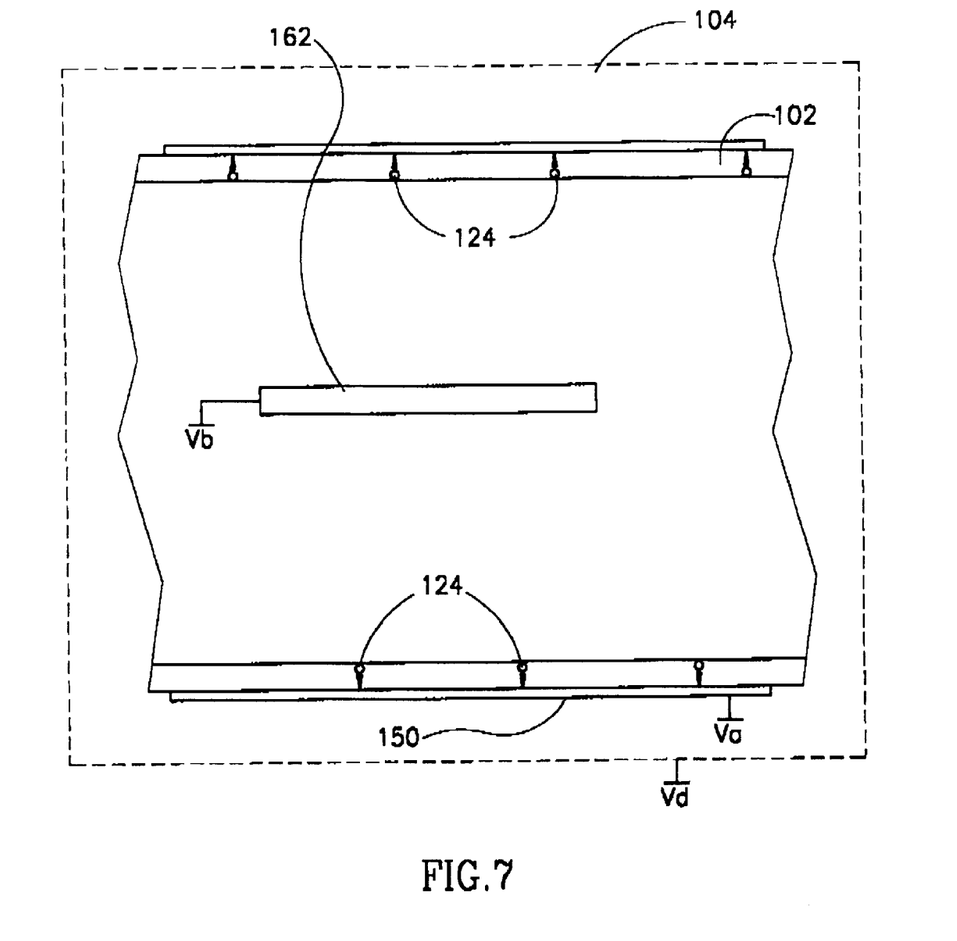
FIG. 7 is a schematic illustration of a thermoemission system for cleaning a processing oven, constructed and operative in accordance with a fourth preferred embodiment of the present invention.

Reference is now briefly made to FIG. 7 which illustrates cleaning apparatus for just cleaning the reaction core 102 when such is formed of quartz or of other materials. The core cleaning apparatus comprises a conductive element 162, such as a silicon carbide rod, connected to the voltage source Vb and the core collector 150 mounted outside the reaction core 102 and connected to the core voltage source Va. In the presence of temperatures above 600° C., the voltages Vb and Va and a conductive medium within reaction core 102, an electric field is generated which is directed towards core collector 150. This electric field encourages positive ions 124 within reaction core 102 to collect on core collector 150, thereby cleaning reaction core 102.

The core cleaning operation can be performed between semiconductor processing operations thereby to minimize contamination of reaction core 102.

Figure 8A:
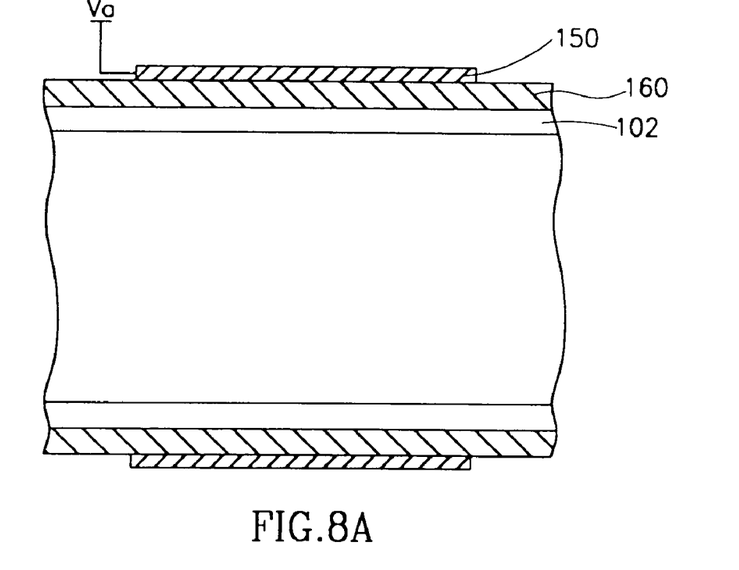
FIGS. 8A and 8B are schematic illustrations of two embodiments of the placement of a core collector electrode with respect to the location of the reaction core and its insulating layer.
Figure 8B:
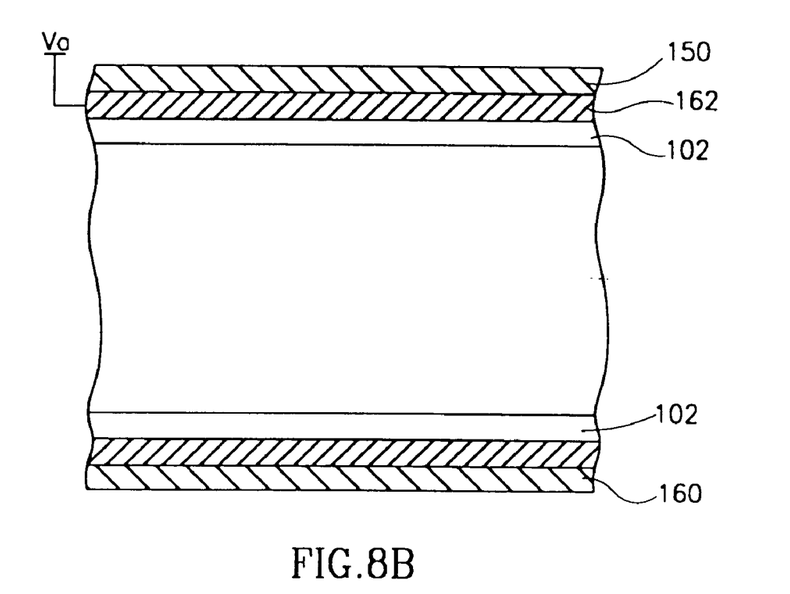

Reference is now made to FIGS. 8A and 8B which illustrate possible placements of the core collector 150 with respect to the reaction core 102. As shown in FIG. 8A, the reaction core 102 typically is covered by an insulating layer 160. In one embodiment, the core collector 150 is mounted on the outside of the insulating layer 160, as shown in FIG. 8A. Alternatively, the core collector 150 can be mounted between the reaction core 102 and the insulating layer 160, thereby to minimize any contamination to the reaction core 102 caused by the movement of ions from the insulating layer 160 to the reaction core 102.

It will be appreciated that the embodiments of the batch apparatus of the present invention not only clean the contaminated wafers 122 but, if the apparatus is not removed from the reaction core 102, the batch apparatus will maintain the cleanlines of the now cleaned wafers. Thus, the present invention incorporates a storage unit having the elements of any of the embodiments provided hereinabove. The storage unit is heated to the appropriate temperature and a vacuum, and, if desired, an inert gas, is provided therewithin. In addition, the appropriate voltages are provided to the various electrodes, thereby maintaining the electric field and other elements of the clean environment.

It will be appreciated by persons skilled in the art that the present invention is not limited to what has been particularly shown and described hereinabove. Rather the scope of the present invention is defined only by the claims which follow.

What is claimed is:

1. A method for cleaning at least one semiconductor wafer and comprising the steps of:

having a first group of semiconductor wafers which receives a first voltage level;

having conductive means which receives a second voltage level below that of said first voltage level; and activating said first and second voltage levels in order to clean said wafer by attracting contaminates toward said conductive means.

2. A method according to claim 1 and wherein having a conductive means comprises employing a second group of semiconductor wafer.

3. A method according to claim 2 and comprising the step of cleaning said first group of semiconductor wafers while employing said second group of semiconductor wafers as collector electrodes.

4. A method according to claim 1 and comprising the step of having a core collector electrode having a third voltage level below that of said second voltage level.

* * * * *